United States Patent
Birdsley et al.

(10) Patent No.: US 6,472,760 B1
(45) Date of Patent: Oct. 29, 2002

(54) NANOMACHINING OF INTEGRATED CIRCUITS

(75) Inventors: Jeffrey D. Birdsley; Michael R. Bruce; Brennan V. Davis; Rosalinda M. Ring, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 43 days.

(21) Appl. No.: 09/755,011

(22) Filed: Jan. 5, 2001

(51) Int. Cl.[7] .............................................. H01L 23/48
(52) U.S. Cl. ........................................ 257/778; 257/347
(58) Field of Search .......................... 257/48, 374, 523, 257/524, 520, 622, 623, 621, 774, 777, 778, 737, 347, 45

(56) References Cited

U.S. PATENT DOCUMENTS 6,211,080 B1 * 4/2001 Tatah ........................ 438/662

\* cited by examiner

Primary Examiner—Jey Tsai

(57) ABSTRACT

The present invention is directed to enhancing the analysis and modification of a flip chip integrated circuit die having silicon on insulator (SOI) structure. According to one example embodiment, an optical nanomachining arrangement is adapted to direct an optical beam, such as a laser, at a selected portion of the flip chip SOI structure. The optical beam performs device edits to modify the circuitry contained in the SOI selected portion without necessarily damaging surrounding circuitry. The ability to make such device edits is advantageous for various applications, such as in dies of complex, circuitry containing multiple stacked layers of components, and for dies having densely packed circuitry.

1 Claim, 3 Drawing Sheets

NANOMACHINING OF INTEGRATED CIRCUITS

FIELD OF THE INVENTION

The present invention relates generally to semiconductor devices and their fabrication and, more particularly, to semiconductor devices and their manufacture involving techniques for analyzing and debugging circuitry within an integrated circuit.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

To increase the number of pad sites available for a die, different chip packaging techniques have been used. One technique is referred to as a dual in-line package (DIP) in which bonding pads are along the periphery of the device. Another technique, called controlled-collapse chip connection or flip chip packaging, uses the bonding pads and metal (solder) bumps. The bonding pads need not be on the periphery of the die and hence are moved to the site nearest the transistors and other circuit devices formed in the die. As a result, the electrical path to the pad is shorter. Electrical connections to the package are made when the die is flipped over the package with corresponding bonding pads. Each bump connects to a corresponding package inner lead. The resulting packages have a lower profile and have lower electrical resistance and a shortened electrical path. The output terminals of the package may be ball-shaped conductive-bump contacts (usually solder or other similar conductive material) and are typically disposed in a rectangular array. These packages are occasionally referred to as "Ball Grid Array" (BGA). Alternatively, the output terminals of the package may be pins, and such a package is commonly known as the pin grid array (PGA) package.

For BGA, PGA and other types of packages, once the die is attached to the package, the backside portion of the die remains exposed. The transistors and other circuitry are generally formed in a very thin epitaxially grown silicon layer on a single crystal silicon wafer of which the die is singulated from. In a structural variation, a layer of insulating silicon dioxide is formed on one surface of a single crystal silicon wafer followed by the thin epitaxially grown silicon layer containing the transistors and other circuitry. This wafer structure is termed "silicon on insulator" (SOI) and the silicon dioxide layer is called the "buried oxide layer" (BOX). The transistors formed on the SOI structure show decreased drain capacitance, resulting in a faster switch transistor.

The side of the die including the epitaxial layer, containing the transistors and the other active circuitry, is often referred to as the circuit side of the die or front side of the die. The circuit side of the die is positioned very near the package. The circuit side opposes the backside of the die. Between the backside and the circuit side of the die is single crystalline silicon and, in the case of SOI circuits, also a buried oxide layer. The positioning of the circuit side provides many of the advantages of the flip chip.

In some instances the orientation of the die with the circuit side face down on a substrate may be a disadvantage or present new challenges. For example, when a circuit fails or when it is necessary to modify a particular chip, access to the transistors and circuitry near the circuit side is typically obtained only from the backside of the chip. This is challenging for SOI circuits since the transistors are in a very thin layer (about 10 micrometers) of silicon covered by the buried oxide layer (less than about 1 micrometer) and the bulk silicon (greater than 500 micrometers). Thus, the circuit side of the flip chip die is not visible or accessible for viewing using optical or scanning electron microscopy.

Additionally, as designers work to reduce dimensions of circuitry components to increase speed and fit more circuitry on a die, the resulting submicron structure of tightly spaced components presents increased challenges to debugging or modifying the die circuitry. The presence of a buried oxide layer adds to the difficulty. Existing machining and/or milling methods, such as FIB or laser etching, do not provide the needed accuracy and precision required to debug or modify new smaller circuitry components. Damage to surrounding circuitry occurs when attempting to access and modify a particular component using current methods. Thus, any circuit modification requires precise and accurate nanomachining for success.

Initially, modification of a flip chip SOI die requires removal of the majority of the bulk silicon layer from the backside. The die receives two or three steps of thinning in the process. First the die receives global thinning across the whole die surface. Mechanical polishing is one method for global thinning. Local thinning techniques, such as laser microchemical etching, thin the silicon in an area to a level that is thinner than the die size. One method for laser microchemical etching of silicon focuses a laser beam on the backside of the silicon surface to cause local melting of silicon in the presence of chlorine gas. The molten silicon reacts very rapidly with chlorine and forms silicon tetrachloride gas, which leaves the molten (reaction) zone. A specific example silicon-removal process uses the 9850 SiliconEtcher™ tool by Revise, Inc. (Burlington, Mass.). This laser process provides for both local and global thinning by scanning the laser over a part of, or the whole, die surface. The thinning stops short of the buried oxide layer (BOX) of the SOI integrated circuit.

Substrate removal can present difficulties. For instance, removal of too much substrate damages the BOX layer and the circuitry of the die. Further, it is desirable to perform precision operations on suspect circuitry portions without damaging surrounding circuitry. Presently, focused ion beam (FIB) systems are capable of removing substrate, but FIB systems also remove all circuitry components in their path to access suspect circuitry regions. Thus, there is an unmet need for a method and system to perform precision device edits on internal circuitry of flip chip BOX dies without affecting surrounding circuitry of the die.

SUMMARY OF THE INVENTION

The present invention is directed to a method and system for nanomachining a semiconductor device having SOI structure using an optical beam. The present invention is exemplified in a number of implementations and applications, some of which are summarized below.

According to an example embodiment, the present invention applies to a thinned backside integrated circuit die having silicon on insulator (SOI) structure. An optical nanomachining system performs device edits to a selected region of the integrated circuit die. The edits can be made, for example, to regions of the circuit buried beneath circuitry or other die structures. In this manner, edits can be made without affecting surrounding circuitry, thereby enhancing semiconductor manufacturing and analysis.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
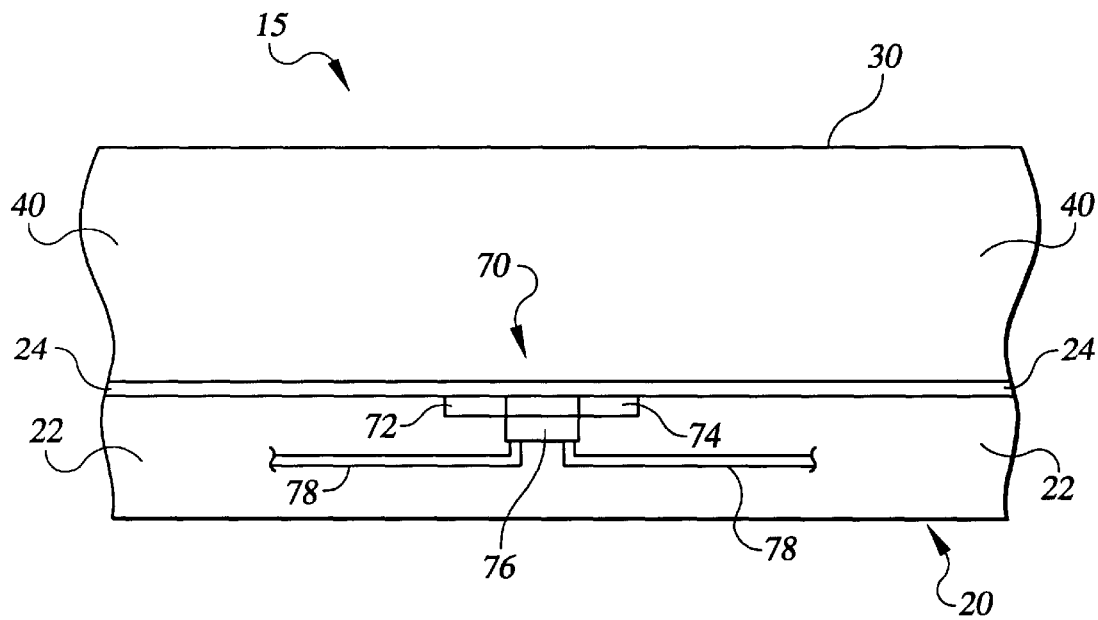
FIG. 1 illustrates a SOI flip chip, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for performing precision operations upon silicon on insulator (SOI) integrated circuits. The SOI die structure includes at least one layer of silicon dioxide between the bulk silicon substrate and an epitaxial silicon layer containing die circuitry. While the present invention is not necessarily limited to such SOI devices, various aspects of the invention may be appreciated through a discussion of various examples using this context.

According to a particular embodiment of the present invention, a conventional flip chip type SOI die having a thinned backside is analyzed. An optical nanomachining system is used to perform device edits to a selected region of the integrated circuit die without necessarily affecting surrounding circuitry. The nanomachining system includes a laser beam capable of removing remaining substrate and buried oxide layer at a target area of the selected region of circuitry, and performing device edits to accessed circuitry. The laser beam also is capable of performing device edits to a target area of a selected region of circuitry covered by one or more layers of overlying circuitry. In this manner, edits can be made without affecting surrounding circuitry, thereby enhancing semiconductor manufacturing and analysis.

Figure 2:
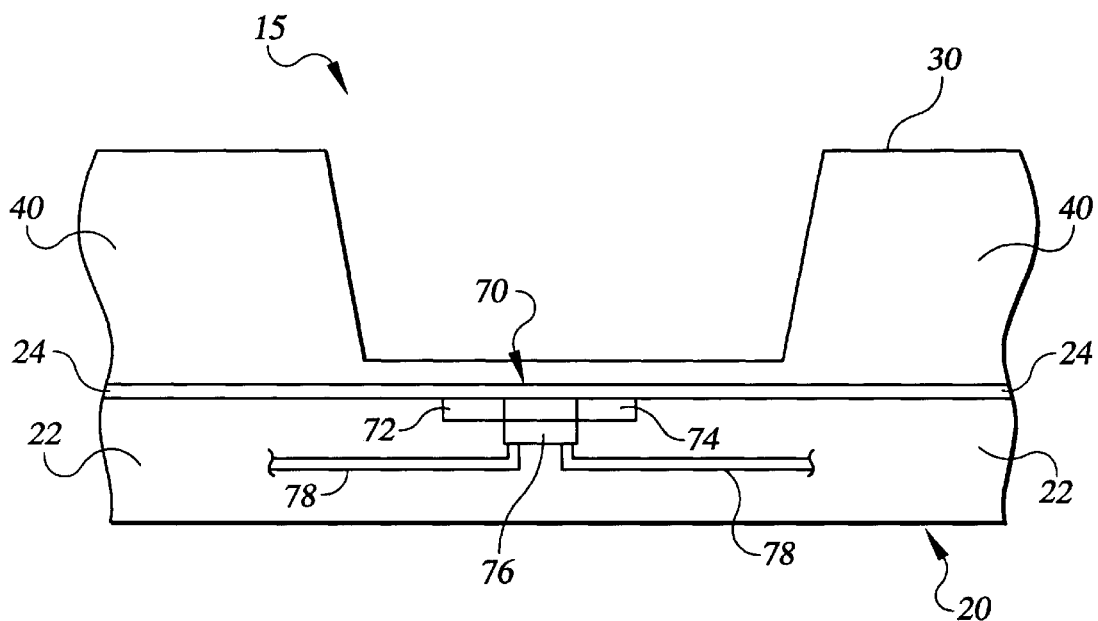
FIG. 2 illustrates a thinned SOI flip chip, according to another example embodiment of the present invention.

FIGS. 1 and 2 provide cross sectional views of an SOI die 15, having a circuit side 20 and a backside 30. In FIG. 2 the die 15 received backside thinning according to an example embodiment of the present invention. Backside thinning removes a selected portion of bulk silicon layer 40 without disrupting a buried oxide layer 24. The circuit side 20 includes a number of circuit devices formed in a portion of the die referred to as an epitaxial layer 22. Thinning can be global where the whole die backside 30 receives thinning, or it can be localized in a selected region, as depicted in FIG. 2. Backside thinning provides improved access to the selected region of circuitry for making edits thereto. FIGS. 1 and 2 include a representative portion of circuitry contained in the epitaxial layer 22. The circuitry portion shown is a typical transistor 70 having source and drain regions 72, 74 and a control gate 76 powered by interconnect electrical lines 78. Once the backside 30 of the die 15 has been thinned as in FIG. 2, optical nanomachining is used to perform device edits to a selected region of accessed circuitry of the die, without affecting surrounding circuitry.

Figure 3:
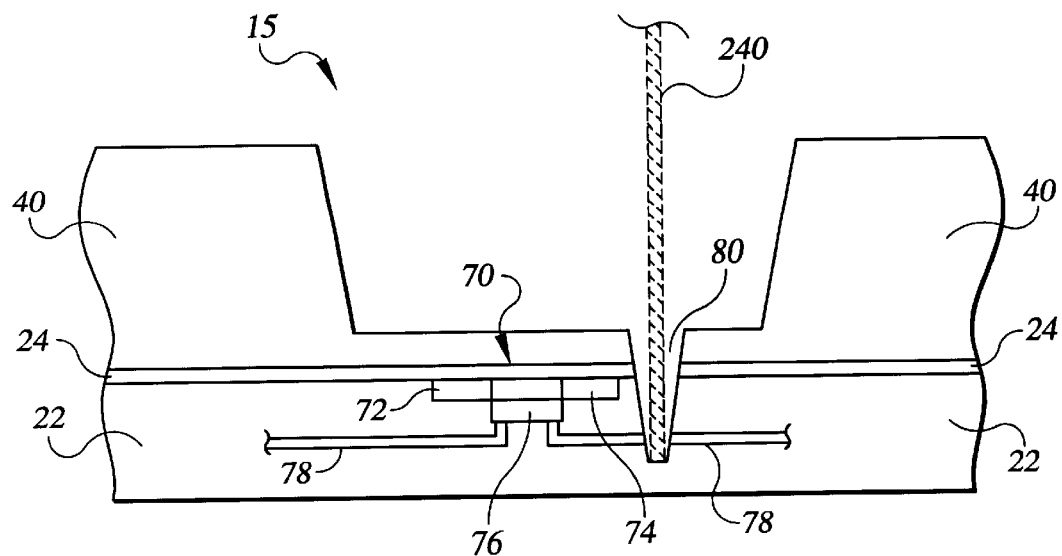
FIG. 3 illustrates a nanomachined SOI flip chip, according to another example embodiment of the present invention.

According to an example embodiment of the invention, FIG. 3 illustrates nanomachining using a laser beam 240 capable of removing remaining substrate 40 and buried oxide layer 24 at a target area of the selected region of circuitry. The laser beam 240 performs device edits to the accessed circuitry, for instance, the transistor 70. The laser beam 240 provides improved nanomachining compared to a FIB. For example, controlling the laser beam pulses determines the depth of material removed by the laser beam from the die 15. Additionally, the half angle taper of the walls of the laser cut 80 in the die material ranges from 3.5 to 5.0 degrees, reflecting nearly vertical walls. The editing of a transistor 70 by disconnecting an interconnect line 78 is depicted in FIG. 3. The depth control and wall cut characteristics of optical laser beam nanomachining prevent damage to surrounding circuitry.

Figure 4:
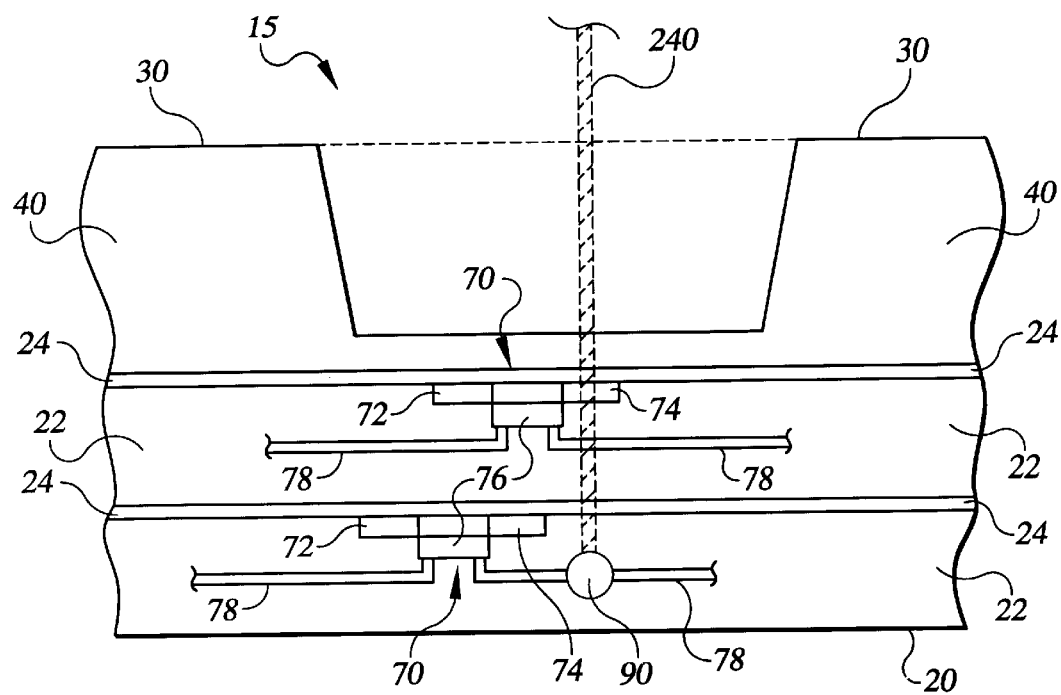
FIG. 4 illustrates another nanomachined SOI flip, according to another example embodiment of the present invention.

According to an example embodiment of the present invention, the laser beam 240 performs device edits to a target area of a selected region of circuitry covered by one or more layers of overlying circuitry, as illustrated in FIG. 4 where two transistors 70 are stacked. In this case the laser beam 240 focuses on a selected buried region of circuitry and, for instance, severs a buried interconnect line 78 by producing a void 90 at an appropriate depth in stacked circuitry structures. Various other device edits available via optical beam nanomachining include reconnecting circuitry components, forming new connections between circuitry components and adding a dopant to a circuitry component.

Figure 5:
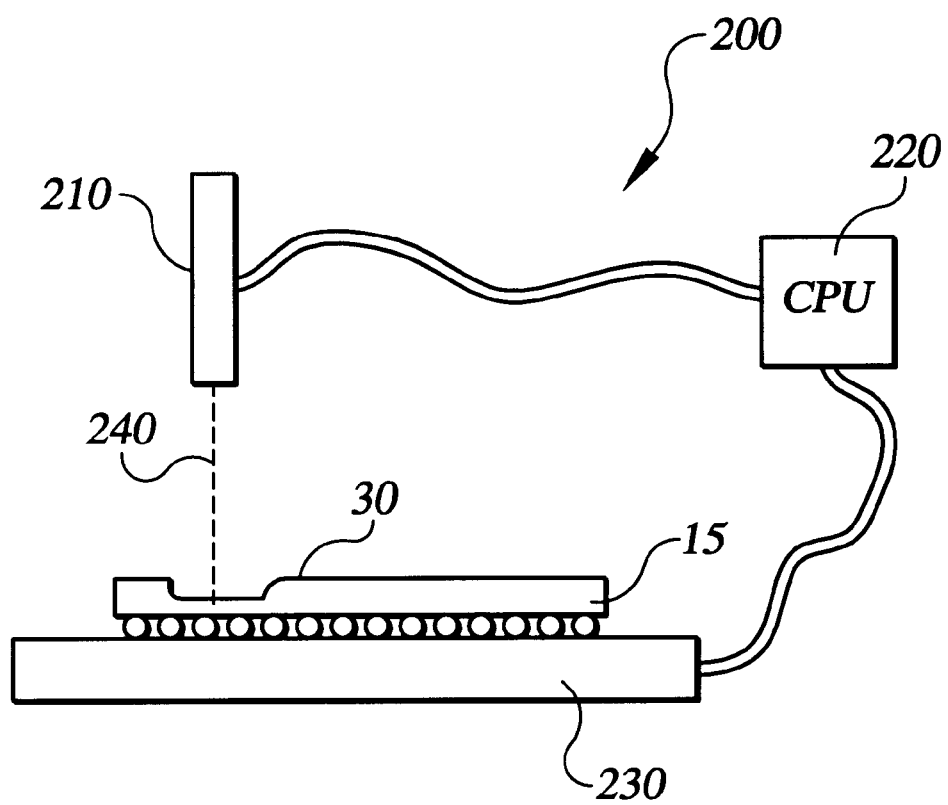
FIG. 5 illustrates a SOI flip chip receiving nanomachining by an optical nanomachining system, according to another example embodiment of the present invention.

In another example embodiment of the present invention, an optical nanomachining system 200 directs an optical beam 240 at the thinned backside 30 of a SOI flip chip die 15, as depicted in FIG. 5. The thinning is stopped short of the buried oxide layer (BOX) 24 adjacent the epitaxial layer 22 and associated circuitry. The optical nanomachining system 200 includes a laser beam generating device 210 controlled by a central processor unit (CPU) 220, such as a computer. The system 200 also includes a navigation platform 230 that supports and positions the flip chip die 15.

In another example embodiment of the invention, the die 15 contains landmark indicia (not shown), used in manufacturing, for determining location of circuitry components. The landmark indicia serve to position the die 15 in a predetermined location on the platform 230. The CPU 220 employs a stored map of the die circuitry to navigate to a selected region of circuitry and pinpoint a location for nanomachining. The CPU 220 also employs the stored map of the die 15 to control the laser beam generating device 210 for nanomachining the die 15 and editing the circuitry contained thereon.

The optical laser beam 240, directed at a selected region of the thinned die backside 30, accesses a circuitry selected region of interest. The laser beam 240 is an ultraviolet laser beam produced by the laser-generating device 210. The laser beam 240 provides improved nanomachining compared to presently used systems. As outlined above, the system 200 performs device edits on tightly packed circuitry components and on regions of circuitry covered by one or more layers of overlying circuitry, thereby enhancing semiconductor manufacture and analysis.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing and modifying a flip chip integrated circuit die having a silicon on insulator (SOI) structure, the method comprising;

providing a die having a thinned backside; and nanomachining the die to access a selected region of circuitry of the SOI structure, and to perform device edits on the accessed selected region of circuitry.

* * * * *